United States Patent
Chevrier et al.

(10) Patent No.: US 9,922,933 B2
(45) Date of Patent: Mar. 20, 2018

(54) METHOD OF POSITIONING ELEMENTS, PARTICULARLY OPTICAL ELEMENTS, ON THE BACK SIDE OF A HYBRIDIZED-TYPE INFRARED DETECTOR

(71) Applicant: SOCIETE FRANCAISE DE DETECTEURS INFRAROUGES-SOFRADIR, Chatenay Malabry (FR)

(72) Inventors: Olivier Chevrier, Claix (FR); Emmanuel Carrere, Coublevie (FR); Nicolas Pere-Laperne, Grenoble (FR)

(73) Assignee: Societe Francaise De Detecteurs Infrarouges-Sofradir, Chatenay Malabry (FR)

( * ) Notice: Subject to any disclaimer, the term of this patent is extended or adjusted under 35 U.S.C. 154(b) by 110 days.

(21) Appl. No.: 14/837,331

(22) Filed: Aug. 27, 2015

(65) Prior Publication Data
US 2016/0064335 A1    Mar. 3, 2016

(30) Foreign Application Priority Data

Sep. 1, 2014    (FR) ..................................... 14 58146

(51) Int. Cl.
*H01L 23/544*    (2006.01)
*H01L 21/02*    (2006.01)
*H01L 21/08*    (2006.01)
(Continued)

(52) U.S. Cl.
CPC .............. *H01L 23/544* (2013.01); *C30B 9/12* (2013.01); *C30B 25/18* (2013.01);
(Continued)

(58) Field of Classification Search
CPC ......... H01L 23/544; H01L 2223/54426; H01L 27/14634; H01L 27/14649; H01L 27/1465;
(Continued)

(56) References Cited

U.S. PATENT DOCUMENTS 4,039,833 A * 8/1977 Thom ............... H01L 27/14881
250/330
5,075,201 A    12/1991 Koh
(Continued)

FOREIGN PATENT DOCUMENTS

EP    1 986 239 A2    10/2008

OTHER PUBLICATIONS

Anonymous, "*Mercury Cadmium Telluride*," Wikipedia, the free encyclopedia, Aug. 26, 2014, [http://en.wikipedia.org/w/index.php?title=Mercury_cadmium_telluride&oldid=622876384].
(Continued)

*Primary Examiner* — Kevin Parendo
(74) *Attorney, Agent, or Firm* — Burr & Brown, PLLC

(57) ABSTRACT

A method of positioning elements or additional technological levels on the incident surface of an infrared detector of hybridized type, said detector being formed of a detection circuit comprising an array network of photosensitive sites for the wavelength ranges of interest, hybridized on a read circuit, said detection circuit resulting from the epitaxial growth of a detection material on a substrate, comprising forming within the detection circuit indexing patterns by marking of the growth substrate.

10 Claims, 2 Drawing Sheets

(51) Int. Cl.
*H01L 21/10* (2006.01)
*H01L 27/146* (2006.01)
*C30B 9/12* (2006.01)
*C30B 25/18* (2006.01)

(52) U.S. Cl.
CPC .... *H01L 21/0243* (2013.01); *H01L 21/02411* (2013.01); *H01L 21/02562* (2013.01); *H01L 21/02617* (2013.01); *H01L 21/08* (2013.01); *H01L 21/101* (2013.01); *H01L 27/1464* (2013.01); *H01L 27/1465* (2013.01); *H01L 27/1469* (2013.01); *H01L 27/14634* (2013.01); *H01L 27/14669* (2013.01); *H01L 27/14683* (2013.01); *H01L 27/14636* (2013.01); *H01L 27/14649* (2013.01); *H01L 27/14696* (2013.01); *H01L 2223/54426* (2013.01); *H01L 2924/0002* (2013.01)

(58) Field of Classification Search
CPC ........... H01L 27/14669; H01L 27/1469; H01L 21/02562; H01L 21/02617; H01L 21/02411; H01L 21/0243; H01L 21/08; H01L 21/101; C30B 9/12; C30B 25/18
See application file for complete search history.

(56) References Cited

U.S. PATENT DOCUMENTS

| | | |
|---|---|---|
| 2001/0054723 A1 | 12/2001 | Narui et al. |
| 2008/0197436 A1 | 8/2008 | Uya |
| 2009/0321013 A1 | 12/2009 | Pitault |
| 2010/0140735 A1* | 6/2010 | Bommena ........... G03F 7/70408 257/506 |
| 2013/0009268 A1* | 1/2013 | Testa ................. H01L 27/14636 257/443 |
| 2013/0285180 A1* | 10/2013 | Wang ................ H01L 27/14618 257/432 |
| 2015/0115413 A1* | 4/2015 | Rudmann ......... H01L 27/14618 257/622 |
| 2016/0064335 A1* | 3/2016 | Chevrier ............... H01L 23/544 438/73 |

OTHER PUBLICATIONS

French Search Report and Written Opinion (Application No. 14.58146) dated May 26, 2015.

* cited by examiner

METHOD OF POSITIONING ELEMENTS, PARTICULARLY OPTICAL ELEMENTS, ON THE BACK SIDE OF A HYBRIDIZED-TYPE INFRARED DETECTOR

FIELD OF THE INVENTION

The invention belongs to the field of electromagnetic radiation detectors, and more particularly of infrared radiation detectors. It more specifically aims at infrared detectors of hybridized type, that is, formed of a detection circuit comprising an array network of photosensitive sites, hybridized on a read circuit.

More specifically still, the invention aims at solving the issue of forming an additional technological level of metal mesh, filter, optical system, or other type, placed on the incident surface of such a hybridized detector.

BACKGROUND

In the field of multi-spectral detection of a hybridized component, that is, capable of detecting a plurality of wavelength ranges, it is known to add an optical filter fixing, due to the performed filtering, said wavelength ranges.

In so-called cooled infrared detection, that is, implementing quantum technology, such a filter may be attached to the cryostat or to the cold shield. In known fashion, the former cools down the detector to allow the operation thereof. The latter limits parasitic optical flows on the detector.

Such a technology does not enable to index and functionalize each of the photosites forming the detection array. The optical elements at the level of the cryostat or of the cold shield only allow a functionalizing of all the photosites of said array.

It has already been provided as an alternative technology to place the filter directly on the hybridized component, and particularly on the incident surface thereof, that is, the surface receiving the incident radiation to be detected.

Independently from the way in which such an optical element is attached to the back side, a real issue resulting from the alignment of the additional technological level relative to each of the photosites formed within the detection circuit is raised. This issue is all increased by the fact that said photosites may be functionalized independently from one another. Indeed, if the alignment of such an additional technological level relative to the detection sites is not correct, each of the sites is capable of receiving different wavelengths of the incident radiation, then affecting the result of the detection, and accordingly the quality of the signal.

According to prior art, the alignment of a technological level on a component is performed by alignment techniques in visible or near infrared imaging. In such wavelength ranges, the alignment of the additional technological level on the photosites may be performed by optical systems in the visible or near infrared range.

The invention is more specifically dedicated to infrared detectors having cut-off wavelengths higher than 1.7 micrometer, for which usual techniques cannot be used.

The object of the present invention thus is to provide a solution enabling to overcome this alignment issue, be it a filter-type optical system, or also the implementation of an additional technological level of metal mesh type.

SUMMARY OF THE INVENTION

On this regard, the invention thus provides a method of positioning elements or technological levels on the incident surface of an infrared detector of hybridized type, said detector being formed of a detection circuit comprising an array network of photosensitive sites for the wavelength range of interest, hybridized on a read circuit.

The method comprises forming, within the detection circuit, indexing patterns by marking of the growth substrate of the detection circuit, the latter resulting from the epitaxial growth of a detection material from said substrate.

In other words, the invention comprises forming, within the detection circuit integrating the photosites, an opening crossing the entire thickness of the active layer of the detector, or a raised portion, that is, in one case or as in the other, a reference point allowing the required alignment of elements or of additional technological levels relative to the detection circuit.

Thus, and according to a first embodiment of the invention, the marking of the detection circuit is formed of one or of a plurality of through vias, formed outside of the active area of the detection circuit, that is, outside of the area where the photosites are present.

According to another embodiment of the invention, a raised area is formed at the level of the growth substrate on forming of the detection circuit, here again outside of the active area of said circuit.

Whatever the implemented embodiment, the alignment is performed by means of a conventional hybridization device (known as "flip-chip bonding") enabling to achieve an accuracy in the order of one micrometer.

BRIEF DESCRIPTION OF THE DRAWINGS

The way in which the invention may be implemented and the resulting advantages will better appear from the following non-limiting description, in relation with the accompanying drawings.

DETAILED DESCRIPTION OF THE INVENTION

Figure 1:
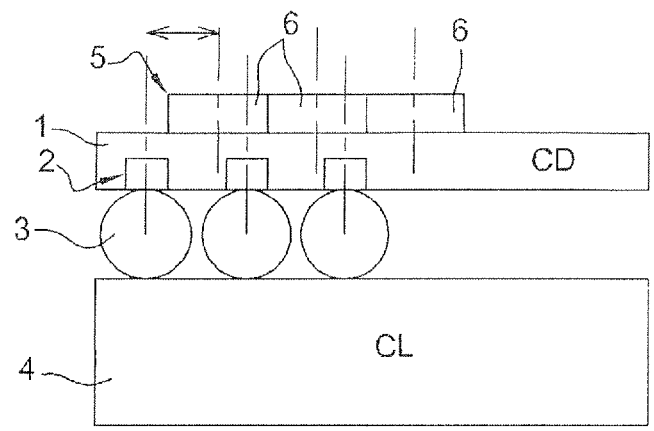
FIG. 1 is a simplified cross-section representation of a hybridized detector provided with an optical filter illustrating the disadvantage of prior art.

FIG. 1 thus shows a back-side illuminated hybridized detector. Such a detector is conventionally formed of a detection circuit (1) comprising an array network of photosites or pixels (2). Such a detection circuit is conventionally made of alloys having generic formula HgCdTe, a material well known to absorb infrared electromagnetic radiation. Such a material is conventionally obtained by liquid- or vapor-phase epitaxy or also by molecular jet epitaxy, based on a substrate made of a solid CdZnTe alloy, or as a variation on a semiconductor substrate of Si, Ge, or AsGa type.

The detection circuit may further be made of other materials well known for their infrared detection capacity, and particularly InGaAs, InSb, InAsSb, and type-II superlattices, that is, of well/barrier stacks based on InAs/GaSb.

Such a detection circuit (1) is hybridized at the level of each of the photosites or pixels (2) by means of microbeads (3), particularly made of indium, on a read circuit (4) intended to transform the electric signals generated by the detection circuit, especially by amplifying them to make them capable of undergoing a subsequent processing.

The read circuit (4), typically made of silicon, is hybridized to the detection circuit by the well-known so-called flip-chip bonding technology.

FIG. 1 shows a filter (5), advantageously capable of expanding along with the detection circuit (1), and for example made of a single- or multiple-layer dielectric material of ZnS, $SiO_2$, $YF_3$ . . . , type and generally any dielectric material or material dedicated to infrared.

FIG. 1 shows with a double horizontal arrow the offset capable of occurring between the different areas (6) of the filter, tuned to the wavelengths of interest, which do not properly cover the corresponding pixel.

Figure 2:
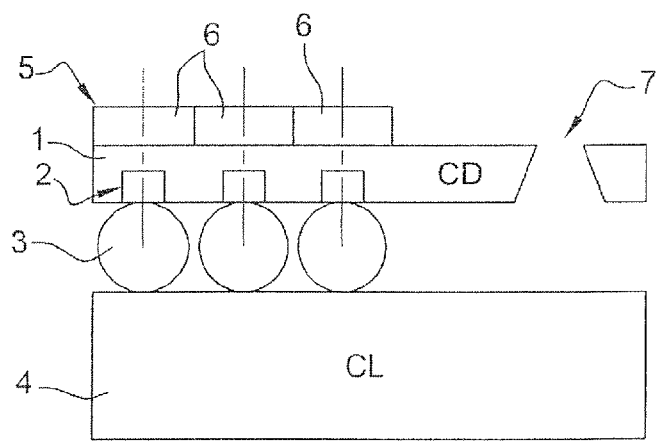
FIG. 2 is a representation similar to FIG. 1 illustrating the first embodiment of the invention.

Thus, and according to a first embodiment illustrated in FIG. 2, a through via (7) is formed within the detection circuit (1), capable of forming an alignment pattern during the additional technological step, and for example on forming of the filter or as the latter is being installed.

This alignment pattern may have any geometric shape and may particularly have a round, square, cross-shaped, etc. cross-section. It is positioned outside of the active detection area of the detection circuit, that is, outside of any area of presence of photosites or of pixels (2).

The via(s) (7) are formed as follows:
photolithography on the detection circuit outside of the active area,
mechanical etching, particularly by ion machining, or chemical etching, ICP-RIE ("Inductively coupled plasma—Reactive Ion Etching"), or also by laser sublimation.

The etching emerges on the incident surface (or back side) to create visible patterns during the step of assembly and alignment, the depth of the etching being readjusted according to the structure of the hybridized circuit, with a complete etching of the epitaxial layer forming the detection circuit all the way to the substrate in substrate-free hybridized component technology, or an etching of the epitaxial layer and of a portion of the substrate of growth of said epitaxial layer in hybridized component technology with a partially removed substrate.

The substrate of the epitaxial layer may be removed or thinned until allowing the opening of such a formed alignment mark, and thus of the alignment pattern.

Due to the implemented technology, the through via or opening is formed particularly accurately, especially in the order of one micrometer. By standard UV photolithography optical alignment, a photolithography is performed at the front side of the detection circuit on the substrate thereof, and is followed by the etching of the via. The detection circuit then follows all standard manufacturing steps. After hybridization of the detection circuit on the read circuit and removal of the substrate of the detection circuit, the placing or the forming of the additional technological level may be performed with an alignment on the through via(s).

The forming of this additional technological level may be performed by UV photolithography or by any other flip-chip bonding technique.

Figure 3:
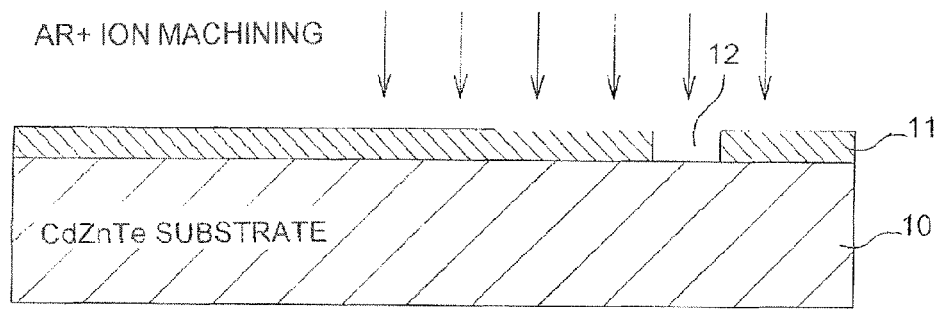
FIGS. 3, 4, and 5 schematically illustrate a second embodiment of the invention.
Figure 4:
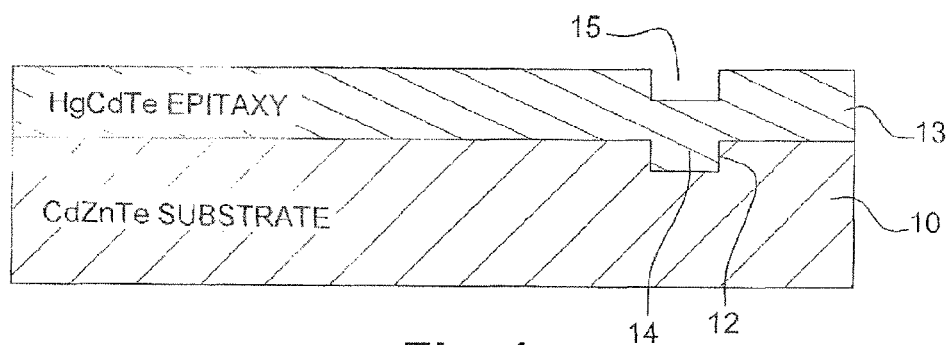
Figure 5:
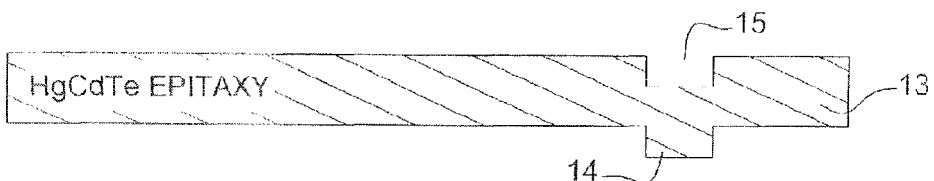

According to a second embodiment illustrated in relation with FIGS. 3 to 5, a detection pattern affecting the layer forming the detection circuit will here again be formed.

However, while as for the previous embodiment, this pattern is formed before the hybridizing of the detection circuit on the read circuit, it is also formed before the epitaxy. Thus, the pattern will result from a modification of the shape of the substrate of growth of the layer forming the detection circuit before the epitaxy.

Thus, this growth substrate (10), typically made of CdZnTe, is coated with a resist (11) by means of a mask enabling to define a specific area (12), a recess relative to the substrate surface where the epitaxy will grow, which area (12), at the next ion machining step, particularly by means of argon ions $Ar^+$, will define a recessed area within said substrate.

The epitaxy (13) occurs subsequently and will first fill the recessed pattern (12) etched in the substrate and, consequently, at the end of the growth, will also have a recessed area (15), such as can be observed in FIG. 4, and simultaneously, symmetrically, a raised area (14) at the back side of the epitaxy layer.

After the substrate has been removed, during the step of etching, and generally of removing the substrate, according to the technology conventionally implemented, typically a chem.-mech. polishing and a chemical etching, this protrusion or raised area (14) is present at the back side of the detection circuit thus formed. It is formed outside of the area of implantation of the detection photosites.

The raised area (14) will form the alignment pattern. Advantageously, the pattern has the largest possible slope relative to the back side of the detection circuit, if possible a 90-degree angle, to obtain a better accuracy on alignment, and in particular on forming of the filter, here again formed by photolithography at the back side or on installation thereof.

The advantage of the present invention which, by the implementation of widely tried and tested technologies, enables to do away with the disadvantages of prior art in terms of alignment of filters and, generally, of any additional technological level at the level of hybridized back-side illuminated detector circuits, thus appears.

The invention claimed is:

1. A method of positioning an optical filter on an incident surface of an infrared detector of hybridized type, the incident surface having a perimeter and receiving infrared radiation to be detected by said infrared detector being formed of a detection circuit comprising an array network of photosensitive sites for a wavelength range of interest, hybridized on a read circuit, said detection circuit resulting from an epitaxial growth of a detection material on a growth substrate, wherein the method comprises forming, within said detection circuit, indexing patterns having a geometric shape on the incident surface of said infrared detector, such that the entirety of the geometric shape is formed within the perimeter of the incident surface of said infrared detector, for the positioning of the optical filter relative to said detection circuit by marking of the growth substrate, providing the optical filter to be positioned on the incident surface of said infrared detector, and performing the positioning of the optical filter on the incident surface of said infrared detector such that the optical filter is aligned with the geometric shape.

2. The method of claim 1, wherein the marking of the growth substrate of said detection circuit comprises forming one or a plurality of through vias outside of an active area of said detection circuit.

3. The method of claim 2, wherein the one or the plurality of through vias is formed outside of the area where the photosites are present or implanted.

4. The method of claim 2, wherein the through vias or openings are formed:
by photolithography on said detection circuit outside of the active area thereof,
and then etching by mechanical etching.

5. The method of claim 4, wherein the etching is ion machining.

6. The method of claim 4, wherein the etching is chemical etching.

7. The method of claim 4, wherein the etching is Inductively coupled plasma-Reactive Ion Etching.

8. The method of claim 4, wherein the etching is laser sublimation.

9. The method of claim 1, wherein the marking of the detection circuit results from a previous alteration of the growth substrate, prior to the epitaxial growth, said previous alteration defining a raised area in said detection circuit, formed outside of the active area of said detection circuit.

10. The method of claim 1, wherein the optical filter and the geometric shape are aligned to an accuracy in the order of one micrometer.

\* \* \* \* \*